(12) United States Patent
Lai et al.

(10) Patent No.: US 10,910,268 B2
(45) Date of Patent: Feb. 2, 2021

(54) METHOD OF MANUFACTURING A CHIP PACKAGE

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: COMCHIP TECHNOLOGY CO., LTD., New Taipei (TW)

( * ) Notice: Subject to any disclaimer, the term of this patent is extended or adjusted under 35 U.S.C. 154(b) by 38 days.

(21) Appl. No.: 16/403,626

(22) Filed: May 6, 2019

(65) Prior Publication Data

US 2020/0161183 A1 May 21, 2020

(30) Foreign Application Priority Data

Nov. 16, 2018 (TW) ................. 107140904

(51) Int. Cl.
*H01L 21/00* (2006.01)
*H01L 21/78* (2006.01)
*H01L 21/683* (2006.01)
*H01L 21/56* (2006.01)

(52) U.S. Cl.
CPC ............ *H01L 21/78* (2013.01); *H01L 21/561* (2013.01); *H01L 21/568* (2013.01); *H01L 21/6835* (2013.01); *H01L 2221/6834* (2013.01); *H01L 2221/68327* (2013.01)

(58) Field of Classification Search
CPC ..... H01L 21/78; H01L 21/561; H01L 21/568; H01L 21/6835; H01L 2221/68327; H01L 2221/6834
See application file for complete search history.

(56) References Cited

U.S. PATENT DOCUMENTS

| 5,268,065 | A | * | 12/1993 | Grupen-Shemansky | ................... H01L 21/6835 156/154 |
|---|---|---|---|---|---|
| 5,777,381 | A | * | 7/1998 | Nishida | .................... H01L 23/32 257/685 |
| 2001/0035260 | A1 | * | 11/2001 | Sawano | ............... B41M 5/0256 156/272.2 |
| 2007/0155049 | A1 | * | 7/2007 | Tsai | ....................... H01L 21/561 438/106 |

(Continued)

FOREIGN PATENT DOCUMENTS

| TW | 200725859 A | 7/2007 |
|---|---|---|
| TW | 201626471 A | 7/2016 |

*Primary Examiner* — Richard A Booth
(74) *Attorney, Agent, or Firm* — CKC & Partners Co., LLC

(57) ABSTRACT

A method of manufacturing chip package is disclosed. The method includes providing a wafer having a first surface and a second surface, in which the wafer includes conductive bumps disposed on the first surface; thinning the wafer from the second surface toward the first surface; dicing the wafer to form chips, in which each chip has a third surface and a fourth surface, and at least one of the conductive bumps is disposed on the third surface; disposing the chips on a substrate, such that the conductive bumps are disposed between the substrate and the third surface, in which any two adjacent of the chips are spaced apart by a gap ranging from 50 μm to 140 μm; forming an insulating layer filling the gaps and covering the chips; and dicing the insulating layer along each gap to form a plurality of chip packages.

10 Claims, 12 Drawing Sheets

(56) References Cited

U.S. PATENT DOCUMENTS

2010/0127044 A1* 5/2010 Ota .................... B23K 35/226
228/56.3
2019/0380210 A1* 12/2019 Lin ......................... H05K 3/28

\* cited by examiner

METHOD OF MANUFACTURING A CHIP PACKAGE

CROSS-REFERENCE TO RELATED APPLICATION

This application claims priority to Taiwan Application Serial Number 107140904, filed Nov. 16, 2018, which is herein incorporated by reference.

BACKGROUND

Field of Invention

The present disclosure relates to a method of manufacturing a chip package.

Description of Related Art

In one conventional chip packaging process, semiconductor dies are formed by dicing a wafer and are packaged one by one, which is quite time-consuming and complicated. In an alternative process, a plurality of chip packages is formed by arranging the semiconductor dies one by one on a carrier board, followed by performing a packaging process and a dicing process. This method of manufacturing chip packages is time-consuming and complicated as well, and an alignment offset issue is likely to occur.

SUMMARY

In view of this, one purpose of the present disclosure is to provide a method of manufacturing a chip package to address the abovementioned issues.

One aspect of the present disclosure is to provide a method of manufacturing a chip package. The method includes providing a wafer having a first surface and a second surface opposite thereto, in which the wafer includes a plurality of conductive bumps disposed on the first surface; thinning the wafer from the second surface toward the first surface; dicing the wafer to form a plurality of chips, in which each chip has a third surface and a fourth surface opposite thereto, and at least one of the conductive bumps is disposed on the third surface; disposing the chips on a substrate, such that the conductive bumps are disposed between the substrate and the third surface, in which any two adjacent of the chips are spaced apart by a gap ranging from 50 µm to 140 µm; forming an insulating layer filling the gaps and covering the chips; and dicing the insulating layer along each gap to form a plurality of chip packages.

According to one embodiment of the present disclosure, the wafer further includes a surface treatment layer disposed on each conductive bump.

According to one embodiment of the present disclosure, after the step of forming the surface treatment layer and before the step of thinning the wafer, the method further includes forming a first adhesion layer covering the first surface and the surface treatment layer; and forming a first carrier board on the first adhesion layer.

According to one embodiment of the present disclosure, after the step of thinning the wafer and before the step of dicing the wafer, the method further includes forming a second adhesion layer and a second carrier board covering the second surface, in which the second adhesion layer is disposed between the second carrier board and the second surface.

According to one embodiment of the present disclosure, after the step of forming the second carrier board and before the step of dicing the wafer, the method further includes heating the first adhesion layer to a first temperature, such that the first carrier board and the first adhesion layer are removed; and cleaning conductive bumps and the surface treatment layer of the wafer.

According to one embodiment of the present disclosure, the first temperature ranges from 70° C. to 90° C.

According to one embodiment of the present disclosure, after the step of cleaning the wafer and before the step of dicing the wafer, the method further includes heating the second adhesion layer to a second temperature, such that the second carrier board and the second adhesion layer are removed; and providing a first tape covering the second surface of the wafer.

According to one embodiment of the present disclosure, the second temperature ranges from 110° C. to 130° C.

According to one embodiment of the present disclosure, after the step of dicing the wafer and before the step of disposing the chips on the substrate, the method further includes providing a second tape covering the third surface of the chips; and removing the first tape.

According to one embodiment of the present disclosure, after the step of forming the insulating layer and before the step of dicing the insulating layer along each gap, the method further includes removing the substrate.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
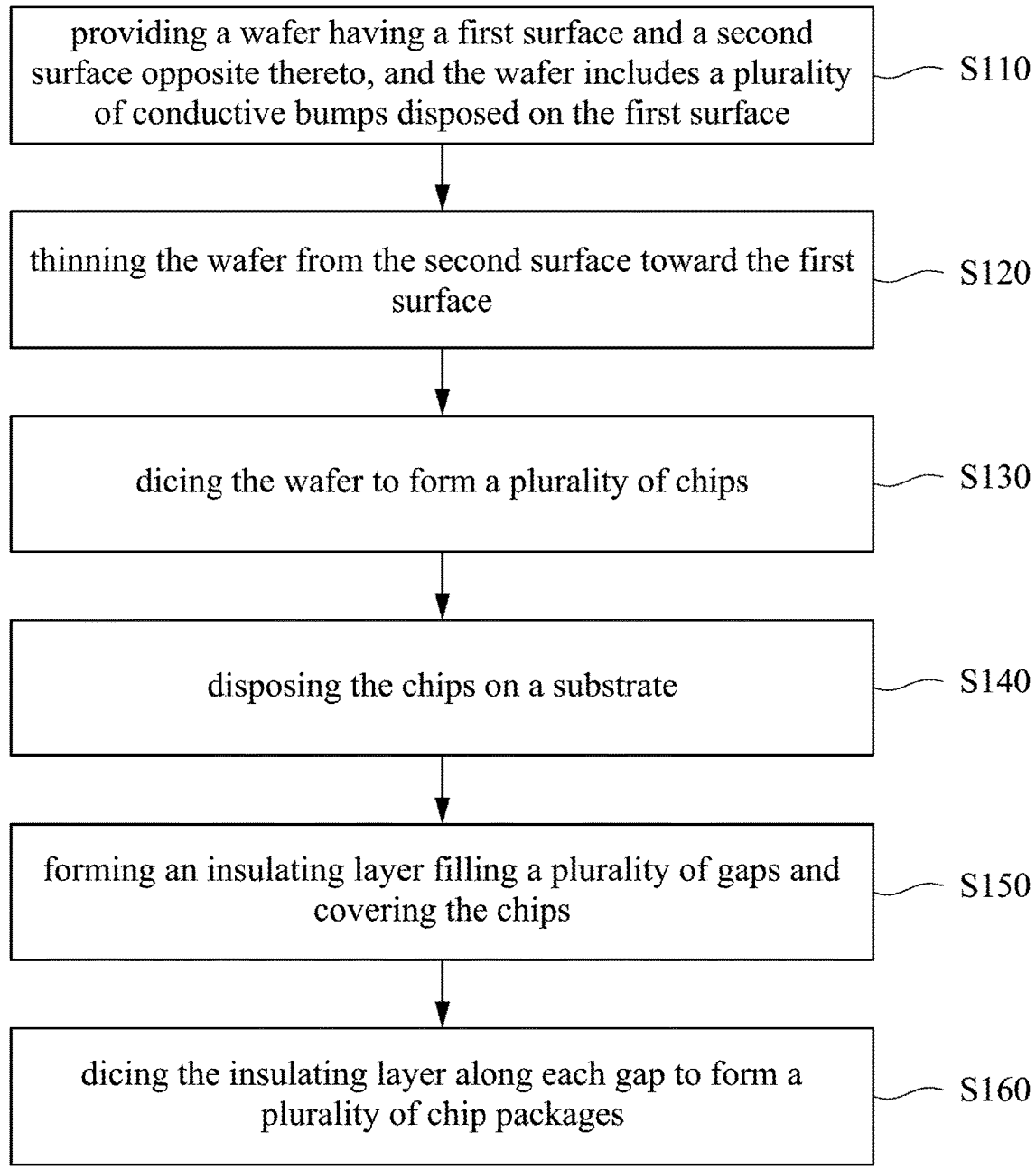
FIG. 1 depicts a flowchart of a method of manufacturing chip packages according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. Other embodiments may be added to an embodiment without further description.

In the following description, certain specific details are set forth in order to provide a thorough understanding of various embodiments of the invention. However, one skilled in the art will understand that the invention may be practiced without these specific details. In other instances, well-known structures and devices are only schematically illustrated in the drawings in order to simplify the drawings.

One aspect of the present disclosure is to provide a method of manufacturing a chip package. The alignment offset issue can be eliminated in the method. FIG. 1 depicts a flowchart of a method 100 of manufacturing chip package according to one embodiment of the present disclosure. FIG. 2A through FIG. 2K are schematic sectional views of intermediate stages in the manufacturing of chip packages according to one embodiment of the present disclosure. As shown in FIG. 1, the method 100 includes step S110, step S120, step S130, step S140, step S150, and step S160.

Figure 2A:
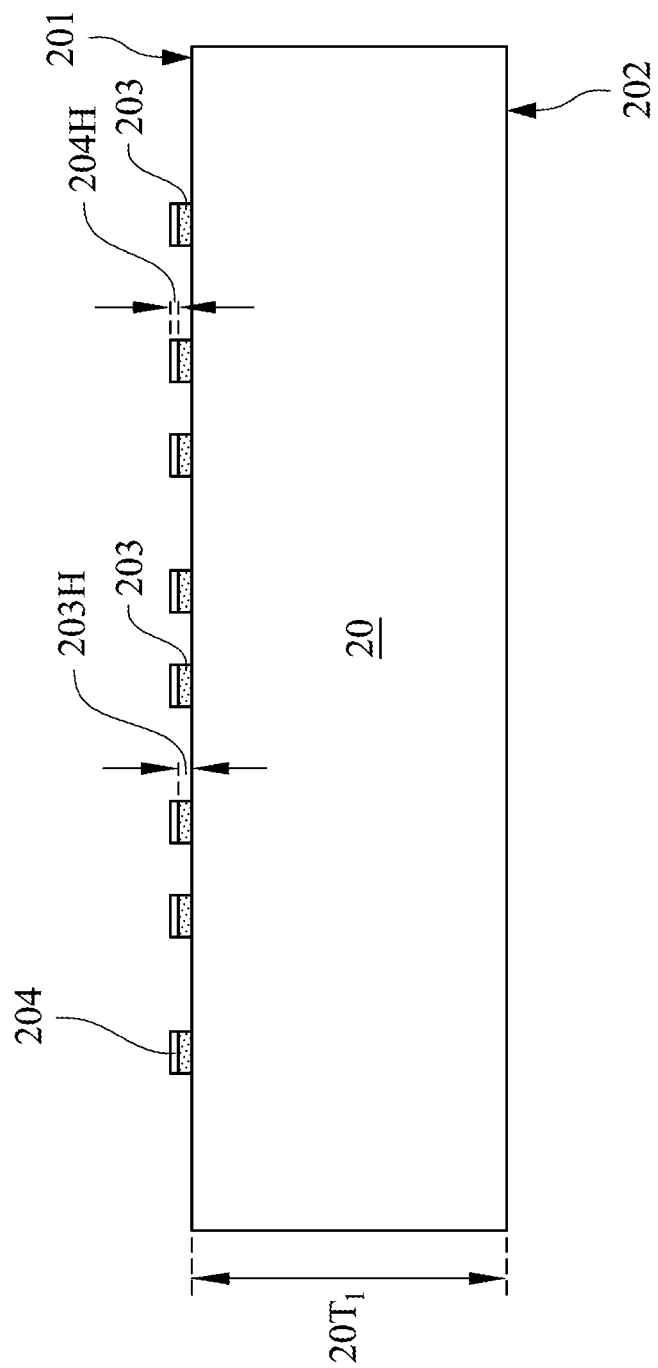
FIG. 2A through FIG. 2K are schematic sectional views of intermediate stages in the manufacturing of chip packages according to one embodiment of the present disclosure.

At step S110, a wafer 20 is provided, as shown in FIG. 2A. Specifically, the wafer 20 has a first surface 201 and a second surface 202 opposite thereto. The wafer 20 further includes a plurality of the conductive bumps 203 disposed on the first surface 201. In one example, the wafer 20 may include silicon, germanium, or a Group III to Group V element, but is not limited thereto. In some examples, the conductive bumps 203 include gold, tin, copper, nickel or other suitable metal material. In one example, a height 203H of each conductive bump 203 may range from 20 µm to 45 µm, such as 22 µm, 24 µm, 26 µm, 28 µm, 30 µm, 32 µm, 34 µm, 36 µm, 38 µm, 40 µm, or 42 µm.

Reference is still made to FIG. 2A. In some embodiments, the wafer 20 further includes a plurality of surface treatment layers 204. Specifically, each surface treatment layer 204 is disposed on each conductive bump 203. In some examples, each surface treatment layer 204 may be a single-layered structure or a multilayered structure composed of sublayers of different materials, in which the single-layered structure may be a nickel layer or a tin layer, and the multilayered structure may be a stacked layer of nickel layer and tin layer, but is not limited thereto. In some examples, a height 204H of each surface treatment layer 204 ranges from 2 µm to 10 µm, such as 3 µm, 4 µm, 5 µm, 6 µm, 7 µm, 8 µm, or 9 µm. The surface treatment layer 204 may be formed by a physical process or a chemical process. The physical process may include but not limited to an electrolytic gold/nickel process and a hot air solder leveling process. The chemical process may include but not limited to an electroless nickel immersion gold (ENIG) process. The surface treatment layer 204 may prevent the conductive bumps 203 from being oxidized by the air. In some examples, a thickness $20T_1$ of the wafer 20 may range from 525 µm to 725 µm, such as 550 µm, 575 µm, 600 µm, 625 µm, 650 µm, 675 µm, or 700 µm.

Figure 2B:
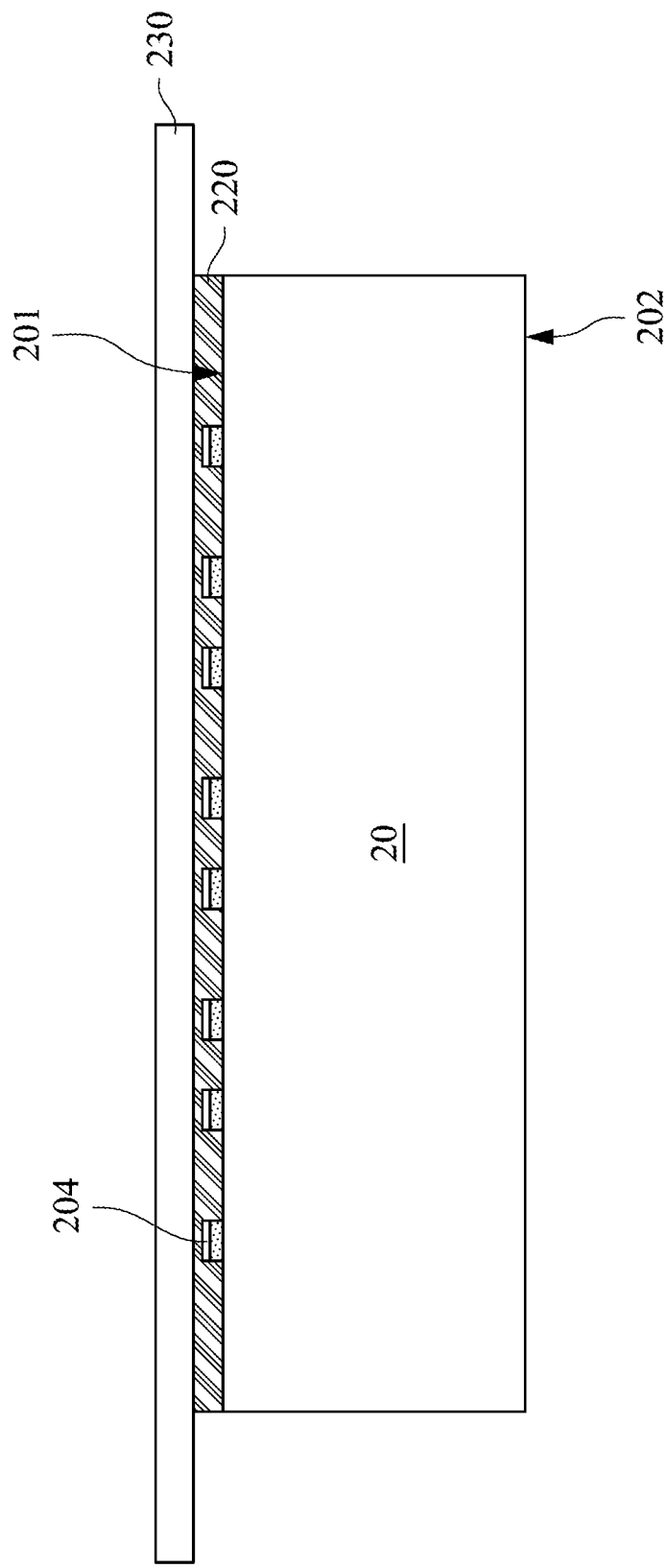

Reference is made to FIG. 2B. In some embodiments, after the step of forming the surface treatment layer 204 and before the step S120, a first adhesion layer 220 is formed covering the first surface 201 and the surface treatment layer 204. Next, a first carrier board 230 is formed on the first adhesion layer 220. The first adhesion layer 220 may reduce the stress occurred during the subsequent thinning process, thus prevent the wafer 20 from cracking. In one example, the first adhesion layer 220 includes a UV release adhesive or a thermal release adhesive. It is noted that a pyrolysis temperature of the first adhesion layer 220 is about 70° C. to 90° C., such as 72° C., 75° C., 77° C., 80° C., 82° C., 85° C., or 87° C. In one example, the first adhesion layer 220 may be formed by a spin coating process, but is not limited thereto. The first carrier board 230 may provide excellent protection for the wafer 20. The first carrier board 230 may be a rigid insulating substrate, such as a glass substrate, ceramic substrate, a sapphire substrate or a quartz substrate, but is not limited thereto.

Figure 2C:
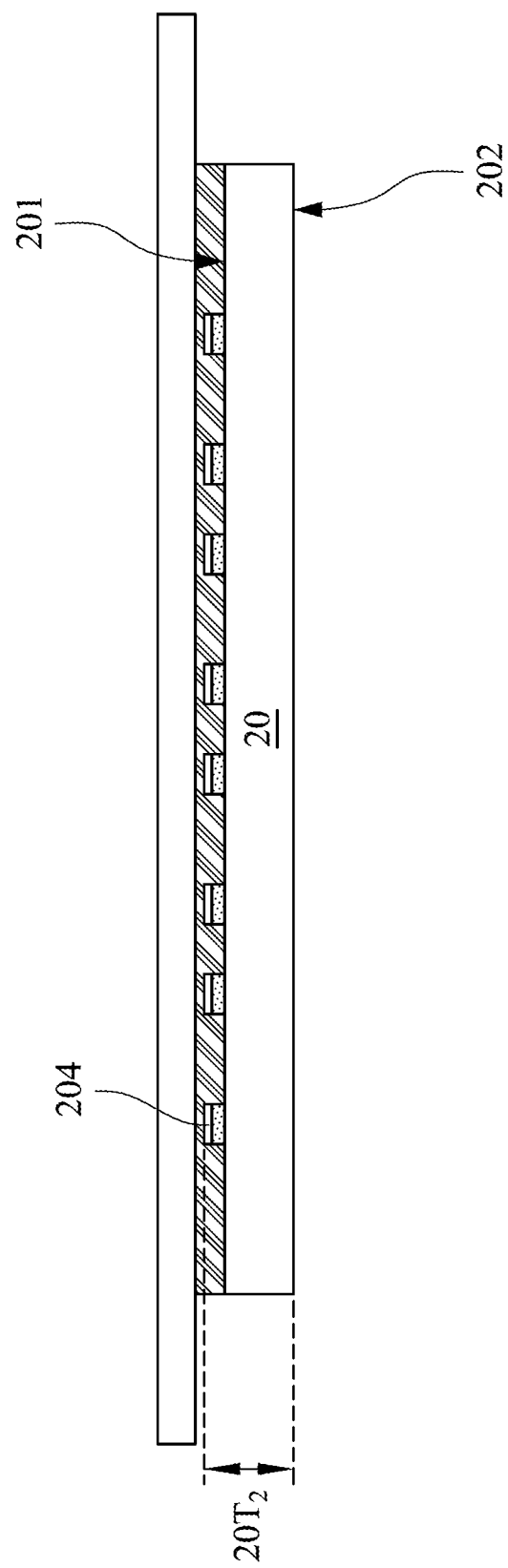

At step S120, the wafer 20 is thinned from the second surface 202 toward the first surface 201, as shown in FIG. 2C. In some examples, the wafer 20 may be thinned by a chemical-mechanical polishing process, a dry etching process or other suitable processes, such that the subsequently formed chip package may have a smaller size. In some examples, after performing the step S120 by thinning the wafer 20, the total thickness $20T_2$ of the wafer 20, the conductive bumps 203 and the surface treatment layer 204 may range from 100 µm to 150 µm, such as 110 µm, 115 µm, 120 µm, 125 µm, 130 µm, 135 µm, 140 µm, or 145 µm.

Figure 2D:
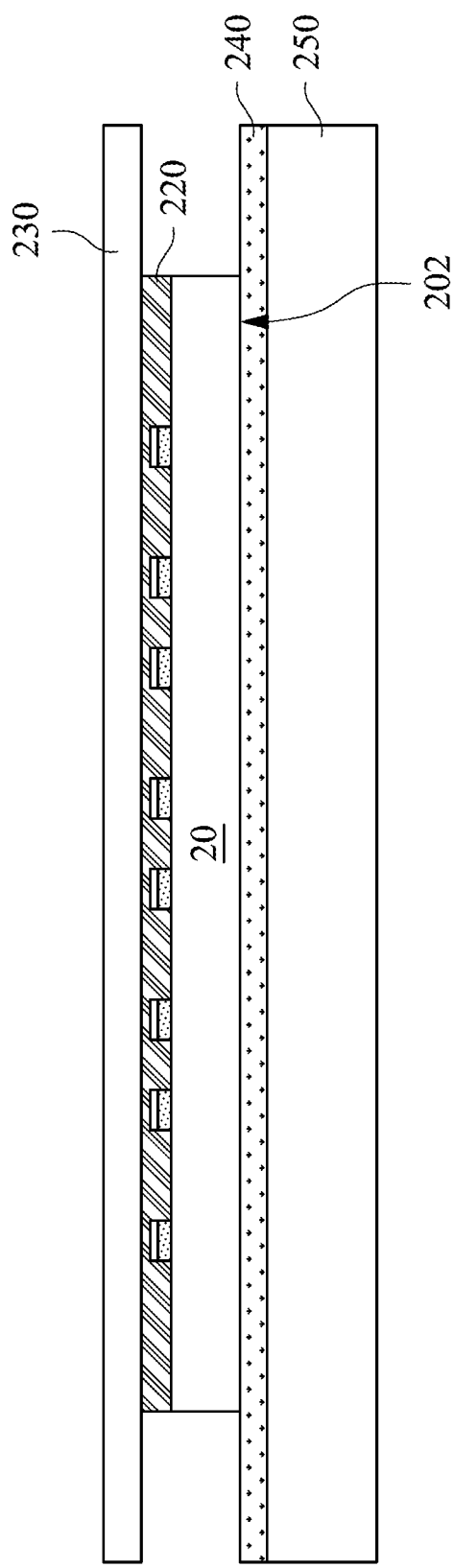

Reference is made to FIG. 2D. In some embodiments, after performing the step S120 by thinning the wafer 20 and before the step S130 is conducted, a second adhesion layer 240 and a second carrier board 250 are formed covering the second surface 202. The second adhesion layer 240 is disposed between the second carrier board 250 and the second surface 202. The second carrier board 250 may support the wafer 20, which is fragile after being thinned, and thereby prevent the wafer 20 from cracking. The second carrier board 250 may be a rigid insulating substrate, such as a glass substrate, ceramic substrate, a sapphire substrate or a quartz substrate, but is not limited thereto. The second adhesion layer 240 may provide the adhesion between the wafer 20 and the second carrier board 250. In one example, the second adhesion layer 240 includes a UV release adhesive or a thermal release adhesive. It is noted that a pyrolysis temperature of the second adhesion layer 240 ranges from about 110° C. to 130° C., such as 112° C., 115° C., 117° C., 120° C., 122° C., 125° C., or 127° C. In one example, the second adhesion layer 240 may be formed by a spin coating process, but is not limited thereto.

Figure 2E:
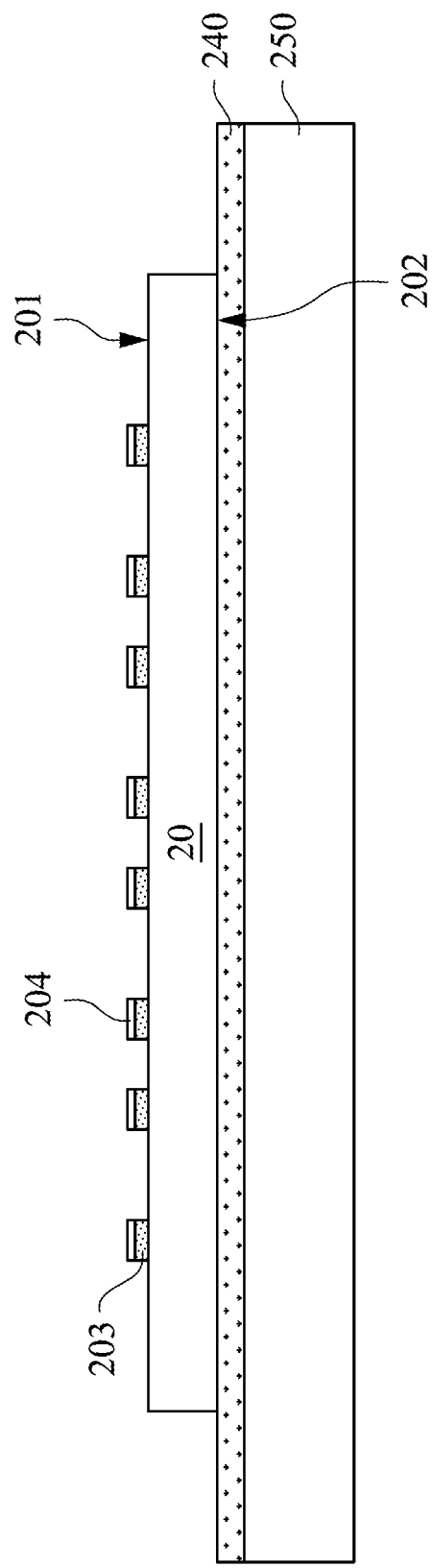

Reference is made to FIG. 2E. In some embodiments, after the step of forming the second carrier board 250 and before the step S130, the first adhesion layer 220 may be heated to a first temperature T1, such that the first carrier board 230 and the first adhesion layer 220 are removed. In one example, the first temperature T1 may range from 70° C. to 90° C., such as 72° C., 75° C., 77° C., 80° C., 82° C., 85° C., or 87° C. In detail, a pyrolysis temperature of the first adhesion layer 220 ranges about 70° C. to 90° C., while a pyrolysis temperature of the second adhesion layer 240 ranges about 110° C. to 130° C. Therefore, in the case the first adhesion layer 220 is heated to the first temperature T1 (that is, 70° C. to 90° C.), the first carrier board 230 may separate from the first adhesion layer 220 due to weak adhesion, while the second carrier board 250 is still bonded to the second surface 202 via the second adhesion layer 240. Moreover, after the first carrier board 230 and the first adhesion layer 220 are removed, the conductive bumps 203 and the surface treatment layer 204 of the wafer 20 are cleaned to remove residual adhesive or dust thereon, thereby avoiding poor electrical contact problem at the application end.

Figure 2F:
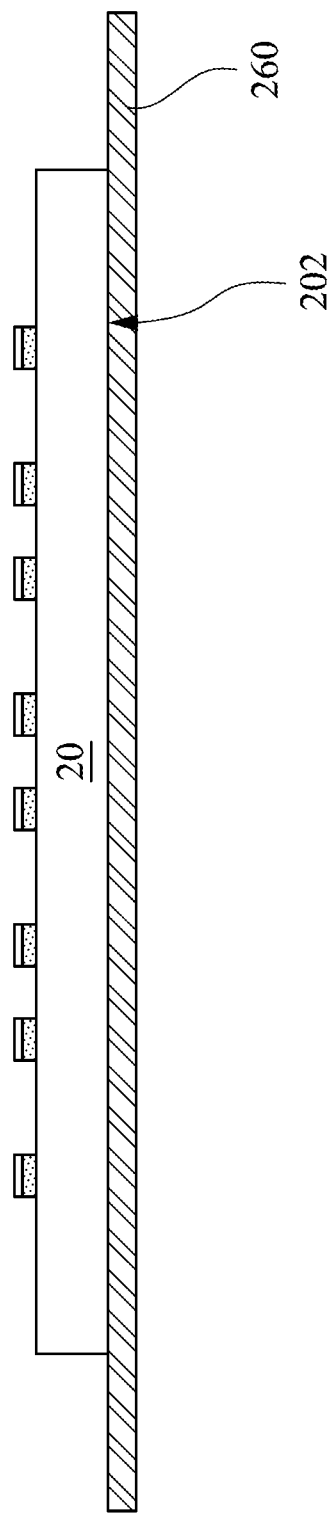

Reference is made to FIG. 2F. In some embodiments, after performing the step by cleaning the wafer 20 and before the step S130, the second adhesion layer 240 may be heated to a second temperature T2, such that the second carrier board 250 and the second adhesion layer 240 are removed. In one example, the second temperature T2 ranges from 110° C. to 130° C., such as 112° C., 115° C., 117° C., 120° C., 122° C., 125° C., or 127° C. Next, a first tape 260 is provided covering the second surface 202 of the wafer 20. The first tape 260 is used to affix the wafer 20 during the subsequent dicing process. In some examples, the first tape 260 may be an elastic dicing tape, such as a UV tape.

Figure 2G:
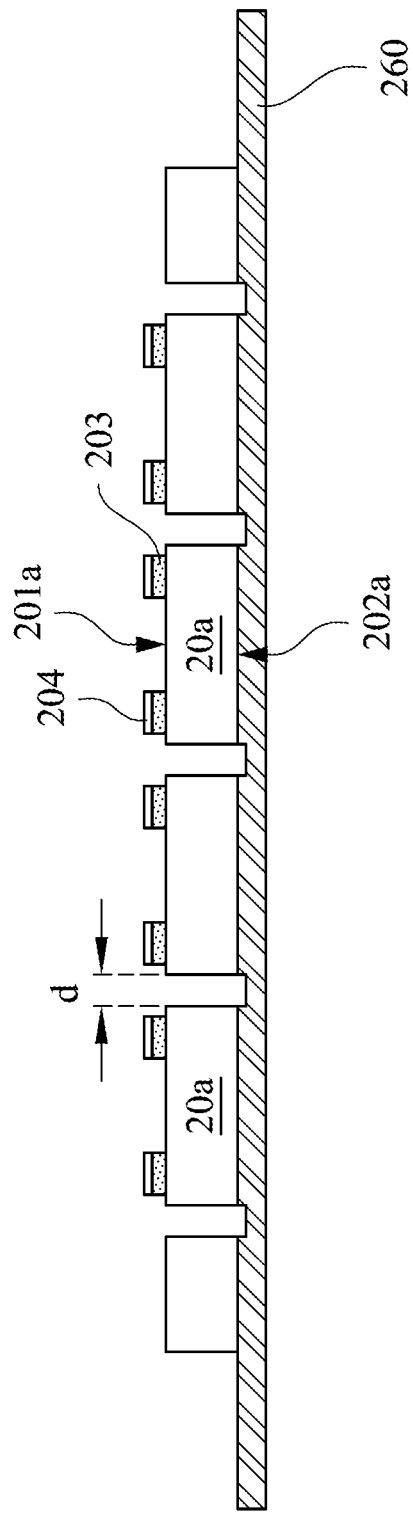

At step S130, the wafer 20 is diced to form a plurality of the chips 20a, as shown in FIG. 2G. In some examples, the step S130 may be done by a wheel cutting process, a laser cutting process, or a waterjet cutting process. As described above, since the first tape 260 is an elastic dicing tape, any two adjacent of the chips 20a are spaced apart by a distance "d" after the wafer 20 is diced. In one example, the distance "d" ranges from 50 µm to 60 µm, such as 52 µm, 54 µm, 56 µm, or 58 µm, but is not limited thereto. After the step S130 is completed, the wafer 20 is diced into a plurality of the chips 20a, and the chips 20a are remained on the original position due to the presence of the first tape 260. Each chip 20a has a third surface 201a and a fourth surface 202a opposite thereto. In addition, each chip 20a includes at least one conductive bumps 203 located on the third surface 201a.

It is understood that the third surface 201a is a portion of the first surface 201 and the fourth surface 202a is a portion of the second surface 202. In some embodiments, each chip 20a may further include the surface treatment layer 204 disposed on the conductive bumps 203.

Figure 2H:
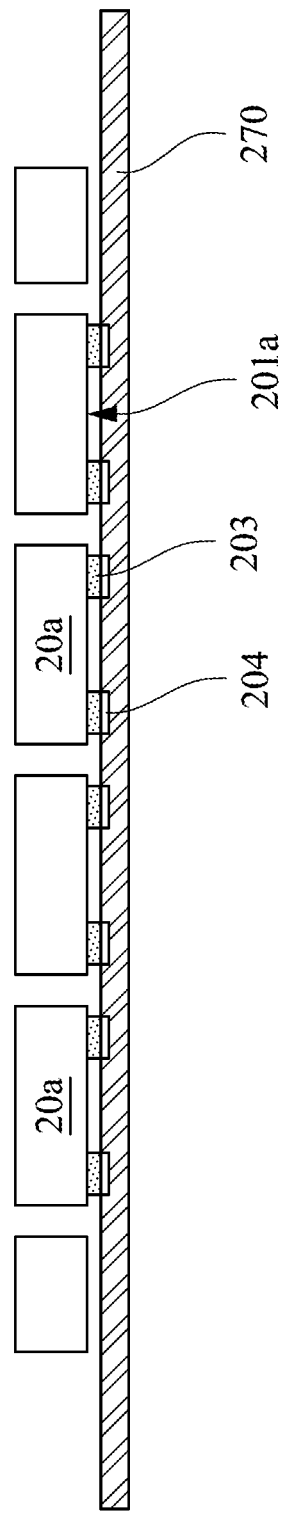

Reference is made to FIG. 2H. In some embodiments, after performing the step S130 by dicing the wafer 20 and before the step S140 is conducted, a second tape 270 is provided covering the third surface 201a of the chips 20a. In some examples, the second tape 270 is a transfer tape, such as a blue tape. The first tape 260 is removed subsequently. Each of the chips 20a is easy to be removed due to the presence of the second tape 270, such that the conductive bumps 203 and the surface treatment layer 204 on the third surface 201a will not be contaminated.

Figure 2I:
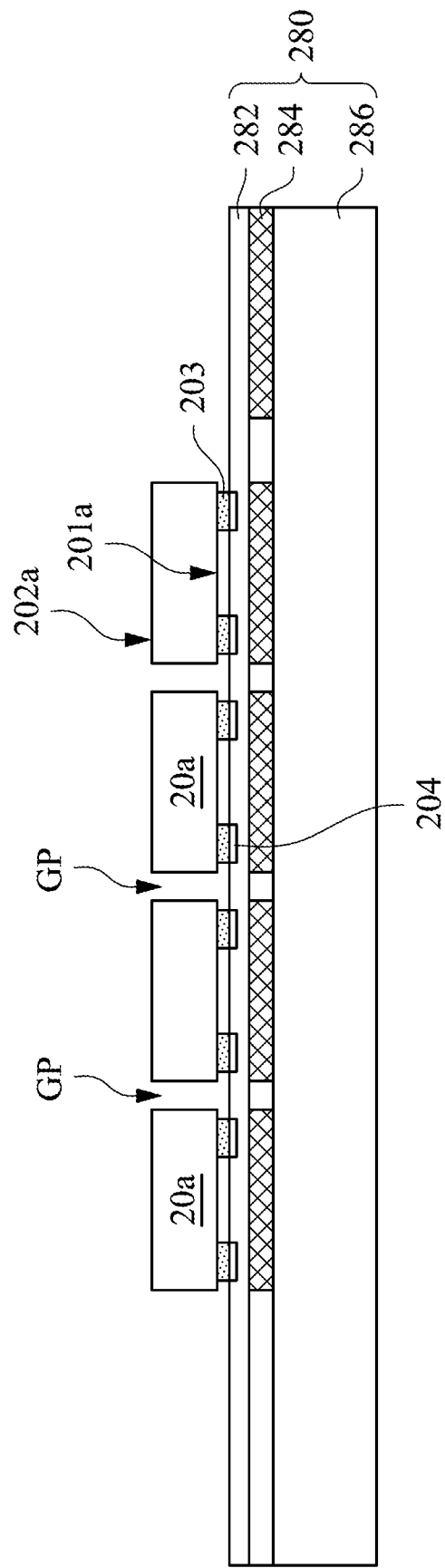

At step S140, the chips 20a are disposed on the substrate 280, as shown in FIG. 2I. It is noted that the conductive bumps 203 of the chips 20a are facing towards the substrate 280, such that the conductive bumps 203 are sandwiched between the substrate 280 and the third surface 201a. Any two adjacent chips 20a are spaced apart by a gap "GP". The gap "GP" may μm from 50 μm to 140 μm, but is not limited thereto. For example, the gap "GP" may range from 50 μm to 60 μm, 60 μm to 70 μm, 70 μm to 80 μm, 80 μm to 90 μm, 90 μm to 100 μm, 100 μm to 110 μm, 110 μm to 120 μm, 120 μm to 130 μm, or 130 μm to 140 μm, but is not limited thereto. Since the chips 20a have been rearranged on the substrate 280 and the relative position of adjacent ones of the chips 20a has been redefined when the step S140 is completed, and therefore the alignment offset issue occurred in the prior art can be eliminated in the subsequent dicing process. In some examples, the substrate 280 may include a polymeric adhesive layer 282, a metal layer 284, and a dielectric layer 286. Specifically, the metal layer 284 is sandwiched between the polymeric adhesive layer 282 and the dielectric layer 286, while the conductive bumps 203 of the chips 20a is sandwiched between the polymeric adhesive layer 282 and the third surface 201a. It is noted that the third surface 201a of the chips 20a and the polymeric adhesive layer 282 have to be spaced apart by a certain distance, such that the third surface 201a of the chips 20a can be covered by an insulating layer subsequently. In one example, the surface treatment layer 204 disposed on the conductive bumps 203 is buried in the polymeric adhesive layer 282. In some examples, the polymeric adhesive layer 282 includes polyimide (PI) or epoxy, the metal layer 284 includes copper (Cu), and the dielectric layer 286 includes FR4 fiberglass, but is not limited thereto.

Figure 2J:
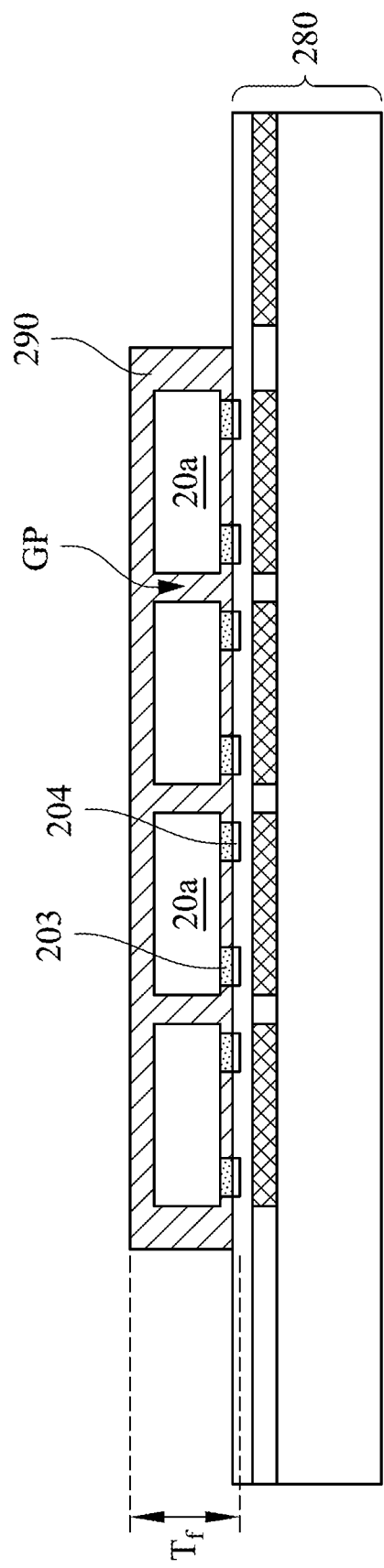

At step S150, an insulating layer 290 is formed filling the gaps GP and covering the chips 20a, as shown in FIG. 2J. The insulating layer 290 may serve as a sealing layer of the chips 20a to protect the exposed outer surface of the chips 20a. In some examples, the insulating layer 290 may be made of polyimide, epoxy, or other suitable insulating material. In some examples, the insulating layer 290 may be formed by a printing process, a coating process or a molding process. In the present example, after the step S150 is completed with the formation of the insulating layer 290, the total thickness $T_f$ of the chips 20a, the insulating layer 290, the conductive bumps 203, and the surface treatment layer 204 ranges from 120 μm to 210 μm, such as 125 μm, 130 μm, 135 μm, 140 μm, 145 μm, 150 μm, 155 μm, 160 μm, 165 μm, 170 μm, 175 μm, 180 μm, 185 μm, 190 μm, 195 μm, 200 μm, or 205 μm. In one embodiment, after step S150 is completed with the formation of the insulating layer 290, the substrate 280 may be removed.

In some examples, after the step S150 is completed with the formation of the insulating layer 290, a laser mark (not shown) may be formed on the insulating layer 290 of each chip to label the product name of the subsequently formed chip package.

Figure 2K:
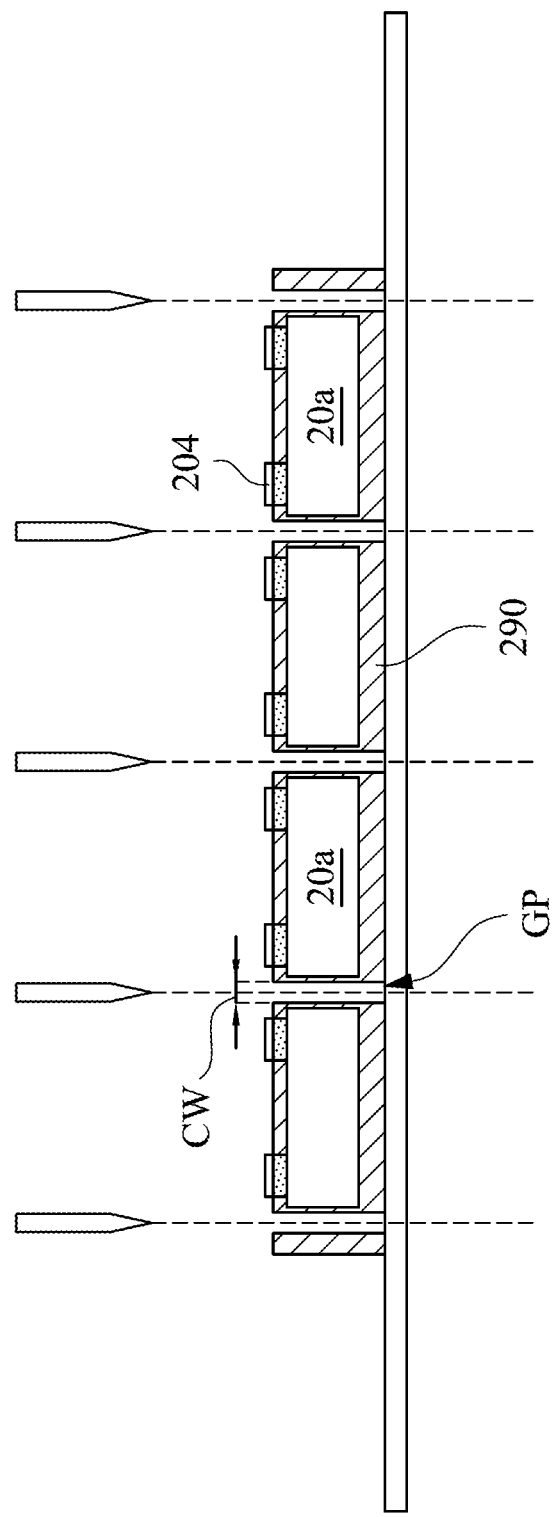

At step S160, the insulating layer 290 is diced along each gap "GP" to form a plurality of chip packages, as shown in FIG. 2K. In one example, the insulating layer 290 may be diced along a center of each gap "GP" to form a plurality of chip packages. In some examples, step S160 may be done by a wheel cutting process, a laser cutting process, or a waterjet cutting process. In the present example, a dicing width "CW" of dicing the insulating layer 290 along each gap "GP" ranges from 15 μm to 100 μm, such as 15 μm to 20 μm, 25 μm to 30 μm, 35 μm to 40 μm, 45 μm to 50 μm, 55 μm to 60 μm, 65 μm to 70 μm, 75 μm to 80 μm, 85 μm to 90 μm, or 95 μm to 100 μm. It is noted that the dicing width "CW" is smaller than a width of the gap "GP". Therefore, when the step S160 is completed, a portion of the insulating layer 290 remains on sidewalls of in each chip package adjacent to the gap "GP" and protects the chips 20a. In other words, every outer surface of the chip package is protected by the insulating layer 290, except that the surface treatment layer 204 is exposed and serves to be electrically connected to other electrical components.

In various examples, the chip packages may be applied in light-sensing elements packaging or light-emitting elements packaging, but the application is not limited thereto. For example, the chip packages may be applied in electronic components of various integrated circuits that including discrete components, active or passive elements, digital or analog circuits, for example optoelectronic devices, micro electro mechanical system (MEMS), microfluidic systems, or physical sensors that measures the variation of some physical quantities such as heat, light, or pressure. Notably, a wafer scale package process (WSP) process may be applied for packaging semiconductor chips such as image-sensing elements, light-emitting diodes (LEDs) or non-light-emitting diodes, solar cells, RF circuits, accelerators, gyroscopes, micro actuators, surface acoustic wave devices, process sensors, or ink printer heads, and the like.

In summary, in the method of manufacturing chip packages disclosed in the present disclosure, the alignment offset issue is eliminated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing chip package, comprising steps of:
   providing a wafer having a first surface and a second surface opposite thereto, wherein the wafer comprises a plurality of conductive bumps disposed on the first surface;
   thinning the wafer from the second surface toward the first surface;
   dicing the wafer to form a plurality of chips, wherein each chip has a third surface and a fourth surface opposite thereto, and at least one of the conductive bumps is disposed on the third surface;

disposing the chips on a substrate, such that the conductive bumps are disposed between the substrate and the third surface, wherein any two adjacent of the chips are spaced apart by a gap ranging from 50 µm to 140 µm;

forming an insulating layer filling the gaps and covering the chips including the third surface and the fourth surface; and dicing the insulating layer along each gap to form a plurality of chip packages.

2. The method of claim 1, wherein the wafer further comprises a surface treatment layer disposed on each conductive bump.

3. The method of claim 2, after the step of forming the surface treatment layer and before the step of thinning the wafer, further comprising:

forming a first adhesion layer covering the first surface and the surface treatment layer; and forming a first carrier board disposed on the first adhesion layer.

4. The method of claim 1, after the step of thinning the wafer and before the step of dicing the wafer, further comprising forming a second adhesion layer and a second carrier board covering the second surface, wherein the second adhesion layer is disposed between the second carrier board and the second surface.

5. The method of claim 4, after the step of forming the second carrier board and before the step of dicing the wafer, further comprising:

heating the first adhesion layer to a first temperature, such that the first carrier board and the first adhesion layer are removed; and cleaning the conductive bumps and the surface treatment layer of the wafer.

6. The method of claim 5, wherein the first temperature ranges from 70° C. to 90° C.

7. The method of claim 5, after the step of cleaning the wafer and before the step of dicing the wafer, further comprising:

heating the second adhesion layer to a second temperature, such that the second carrier board and the second adhesion layer are removed; and providing a first tape covering the second surface of the wafer.

8. The method of claim 7, wherein the second temperature ranges from 110° C. to 130° C.

9. The method of claim 7, after the step of dicing the wafer and before the step of disposing the chips on the substrate, further comprising:

providing a second tape covering the third surface of the chips; and removing the first tape.

10. The method of claim 1, after the step of forming the insulating layer and before the step of dicing the insulating layer along each gap, further comprising removing the substrate.

* * * * *